(12) United States Patent
Cheng et al.

(10) Patent No.: US 9,748,239 B2
(45) Date of Patent: Aug. 29, 2017

(54) FIN-DOUBLE-GATED JUNCTION FIELD EFFECT TRANSISTOR

(71) Applicant: International Business Machines Corporation, Armonk, NY (US)

(72) Inventors: Kangguo Cheng, Schenectady, NY (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/347,326

(22) Filed: Nov. 9, 2016

(65) Prior Publication Data
US 2017/0213824 A1 Jul. 27, 2017

Related U.S. Application Data

(62) Division of application No. 15/007,616, filed on Jan. 27, 2016, now Pat. No. 9,536,789.

(51) Int. Cl.
| | |
|---|---|
| *H01L 27/088* | (2006.01) |
| *H01L 21/3065* | (2006.01) |
| *H01L 29/165* | (2006.01) |
| *H01L 29/16* | (2006.01) |
| *H01L 29/423* | (2006.01) |
| *H01L 29/66* | (2006.01) |

(52) U.S. Cl.
CPC ...... *H01L 27/0886* (2013.01); *H01L 21/3065* (2013.01); *H01L 29/165* (2013.01); *H01L 29/1608* (2013.01); *H01L 29/4232* (2013.01); *H01L 29/66893* (2013.01)

(58) Field of Classification Search
CPC ............ H01L 21/8232; H01L 27/0886; H01L 29/401; H01L 29/66545
See application file for complete search history.

(56) References Cited

U.S. PATENT DOCUMENTS

| | | | |
|---|---|---|---|
| 7,037,790 B2 | 5/2006 | Chang et al. | |
| 7,422,946 B2 | 9/2008 | Doyle et al. | |
| 7,518,189 B1 | 4/2009 | Hackler, Sr. et al. | |
| 7,859,053 B2 | 12/2010 | Chang et al. | |
| 7,915,112 B2 | 3/2011 | Xu et al. | |
| 8,268,689 B2 | 9/2012 | Guo et al. | |

(Continued)

FOREIGN PATENT DOCUMENTS

CN 104766887 A 7/2015

OTHER PUBLICATIONS

U.S. Appl. No. 15/007,616, filed Jan. 27, 2016.

*Primary Examiner* — David Vu
(74) *Attorney, Agent, or Firm* — Scully, Scott, Murphy & Presser, P.C.; Louis J. Percello, Esq.

(57) ABSTRACT

A method of forming a double-gated junction field effect transistors (JFET) and a tri-gated metal-oxide-semiconductor field effect transistor (MOSFET) on a common substrate is provided. The double-gated JFET is formed in a first region of a substrate by forming a semiconductor gate electrode contacting sidewall surfaces of a first channel region of a first semiconductor fin and a top surface of a portion of a first fin cap atop the first channel region. The tri-gated MOSFET is formed in a second region of the substrate by forming a metal gate stack contacting a top surface and sidewall surfaces of a second channel region of a second semiconductor fin.

20 Claims, 6 Drawing Sheets

(56) References Cited

U.S. PATENT DOCUMENTS

| | | |
|---|---|---|
| 8,268,709 B2 | 9/2012 | Chang et al. |
| 8,399,922 B2 | 3/2013 | Chang et al. |
| 8,405,129 B2 | 3/2013 | Chuang et al. |
| 8,426,283 B1 | 4/2013 | Wang et al. |
| 2015/0137235 A1 | 5/2015 | Liu et al. |

FIN-DOUBLE-GATED JUNCTION FIELD EFFECT TRANSISTOR

BACKGROUND

The present application relates to semiconductor device fabrication, and more particularly, to formation of junction field effect transistors (JFETs) and metal-oxide-semiconductor field effect transistors (MOSFETs) on a common substrate.

Junction field effect transistors (JFETs) have unique advantages over metal-oxide-semiconductor field effect transistor (MOSFETs) for certain applications such as, for example, analog circuits. Therefore it is desirable to integrate JFETs and MOSFET on the same chip, particularly for system-on-chip (SoC) applications, without a significant increase in manufacturing cost.

SUMMARY

The present application provides a method of forming a double-gated junction field effect transistors (JFET) and a tri-gated metal-oxide-semiconductor field effect transistor (MOSFET) on a common substrate. The double-gated JFET is formed in a first region of a substrate by forming a semiconductor gate electrode contacting sidewall surfaces of a first channel region of a first semiconductor fin and a top surface of a portion of a first fin cap atop the first channel region. The tri-gated MOSFET is formed in a second region of the substrate by forming a metal gate stack contacting a top surface and sidewall surfaces of a second channel region of a second semiconductor fin.

According to an aspect of the present application, a semiconductor structure is provided. The semiconductor structure includes a junction field effect transistor (JFET) located in a first region of a substrate and a metal-oxide-semiconductor field effect transistor (MOSFET) located in a second region of the substrate. The JFET includes a fin stack of a first semiconductor fin and a first fin cap atop the first semiconductor fin. The first semiconductor fin includes a first channel region and first fin source/drain regions laterally surrounding the first channel region. The first channel region and the first fin source/drain regions are composed of a first semiconductor material and dopants of a first conductivity type. The JFET further includes a semiconductor gate stack straddling the fin stack to form contact with a top surface of the first fin cap and sidewall surfaces of the first channel region. The semiconductor gate stack includes a semiconductor gate electrode composed of a second semiconductor material and dopants of a second conductivity type that is opposite to the first conductivity type. The MOSFET includes a second semiconductor fin containing a second channel region and second fin source/drain regions laterally surrounding the second channel region. The second fin source/drain regions are composed of the first semiconductor material and dopants of the first conductivity type. The MOSFET further includes a metal gate stack straddling the second semiconductor fin to form contact with a top surface and sidewall surfaces of the second channel region. The metal gate stack includes a gate dielectric and a metal gate electrode surrounded by the gate dielectric.

According to another aspect of the present application, a method of forming a semiconductor structure is provided. The method includes forming a first sacrificial gate structure straddling a first fin stack of a first semiconductor fin and a first fin cap atop the first semiconductor fin that is located in a first region of a substrate and a second sacrificial gate structure straddling a second fin stack of a second semiconductor fin and a second fin cap atop the second semiconductor fin that is located in a second region of a substrate. The first sacrificial gate structure includes a first sacrificial gate stack and a first gate spacer located on sidewalls of the first sacrificial gate stack, and the second sacrificial gate structure includes a second sacrificial gate stack and a second gate spacer located on sidewalls of the second sacrificial gate stack. Next, in any order, a junction field effect transistor (JFET) is formed in the first region of the substrate and a metal-oxide-semiconductor field effect transistor (MOSFET) is formed in the second region of the substrate. The JFET is formed by removing the first sacrificial gate stack to provide a first gate cavity while covering the second region of the substrate with a patterned first mask layer. The first gate cavity exposes a portion of the first fin cap and a portion of first semiconductor fin. After doping the exposed portion of the first semiconductor fin with dopants of a first conductivity type, a semiconductor gate electrode is formed over the exposed portion of the first fin cap and the doped exposed portion of the first semiconductor fin. The semiconductor gate electrode includes dopants of a second conductivity type opposite the first conductivity type. The MOSFET is formed by removing the second sacrificial gate stack to provide a second gate cavity while covering the first region of the substrate with a patterned second mask layer. The second gate cavity exposes a portion of the second fin cap and a portion of the second semiconductor fin. Next, the exposed portion of the second fin cap is removed from top of the second semiconductor fin. After forming a gate dielectric over the exposed portion of the second semiconductor fin, a metal gate electrode is formed over the gate dielectric.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
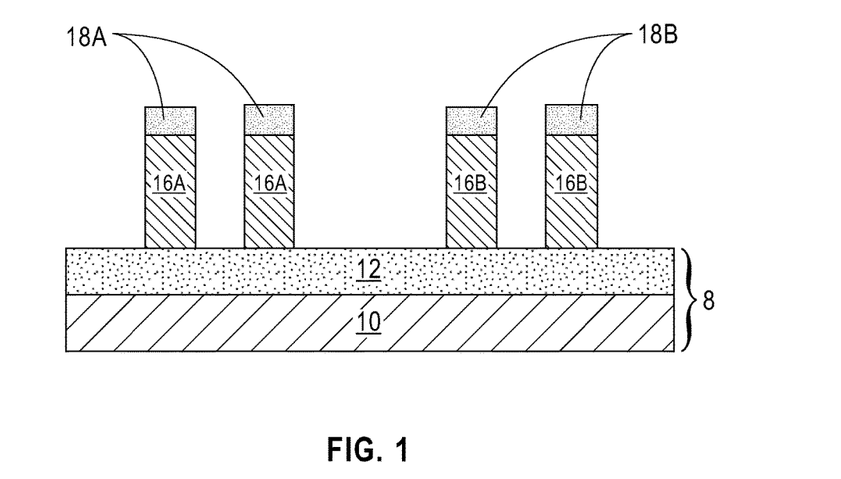
FIG. 1 is a cross-sectional view of an exemplary semiconductor structure including a plurality of first fin stacks formed over a first region of a substrate and a plurality of second fin stacks formed over a second region of the substrate according to an embodiment of the present application.

Referring to FIG. 1, an exemplary semiconductor structure according to an embodiment of the present application includes a plurality of first fin stacks formed over a first region of a substrate 8 and a plurality of second fin stacks formed over a second region of the substrate 8. Each first fin stack includes a first semiconductor fin 16A and a first fin cap 18A located on top of the first semiconductor fin 16A. Each second fin stack includes a second semiconductor fin 16B and a second fin cap 18B located on top of the second semiconductor fin 16B. In one embodiment, the first region can be a JFET region and the second region can be a MOSFET region.

The first fin stacks (16A, 18A) and second fin stacks (16B, 18B) can be formed by first providing a material stacking including a semiconductor substrate and a dielectric cap layer (not shown) located on the semiconductor substrate. In one embodiment, the semiconductor substrate can be a bulk substrate including a bulk semiconductor material throughout. In another embodiment, the semiconductor substrate can be a semiconductor-on-insulator (SOI) substrate including, from bottom to top, a handle substrate 10, a buried insulator layer 12 and a top semiconductor layer (not shown) from which the first and the second semiconductor fins 16A, 16B can be formed.

The handle substrate 10 may include a semiconductor material, such as, for example, silicon (Si), silicon germanium (SiGe), silicon germanium carbide (SiGeC), silicon carbide (SiC), an III-V compound semiconductor, an II-VI compound semiconductor or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 µm to 2 mm, although lesser and greater thicknesses can also be employed.

The buried insulator layer 12 that is formed on the handle substrate 10 may include a dielectric material such as silicon dioxide, silicon nitride, silicon oxynitride, or a combination thereof. The buried insulator layer 12 may be formed using a deposition process including, but not limited to, chemical vapor deposition (CVD), plasma enhanced chemical vapor deposition CVD (PECVD) or physical vapor deposition (PVD). Alternatively, the buried insulator layer 12 may be formed by thermal nitridation and/or thermal oxidation of a surface portion of the handle substrate 10. The buried insulator layer 12 can also be formed by implanting oxygen atoms into a bulk semiconductor substrate and thereafter annealing the structure. The thickness of the buried insulator layer 12 can be from 50 nm to 200 nm, although lesser and greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate 10 may be the same or different. In one embodiment, the top semiconductor layer includes single crystalline silicon. The top semiconductor layer can be formed by CVD or PECVD. The top semiconductor layer that is formed may have a thickness from 20 nm to 600 nm, although lesser or greater thicknesses can also be employed. Alternatively, the top semiconductor layer may be formed using a Smart Cut process where two semiconductor wafers are bonded together with an insulator in between.

The dielectric cap layer that is formed on the top semiconductor layer (or topmost semiconductor surface of a bulk substrate) may include a dielectric material such as, for example, silicon dioxide, silicon nitride, silicon oxynitride, a dielectric metal oxide, or a combination thereof. In one embodiment, the dielectric cap layer is composed of silicon nitride. The dielectric cap layer can be formed by a deposition process including CVD, PECVD or PECVD, or by a thermal growing process such as thermal oxidation or thermal nitridation. The thickness of the dielectric cap layer can be from 5 nm to 20 nm, although lesser and greater thicknesses can also be employed.

The dielectric cap layer and the top semiconductor layer are subsequently patterned to form the first fin stacks (16A, 18A) and the second fin stacks (16B, 18B). For example, a photoresist layer (not shown) can be applied over a top surface of the dielectric cap layer and lithographically patterned to provide a patterned photoresist layer atop portions of the dielectric cap layer. Portions of the dielectric cap layer that are not covered by the patterned photoresist layer are subsequently removed by an anisotropic etch, exposing portions of the top semiconductor layer. The anisotropic etch can be a dry etch such as, for example, reactive ion etch (RIE) or a wet etch involving a chemical etchant that removes dielectric material of the dielectric cap layer selective to the semiconductor material of the top semiconductor layer. Remaining portions of the dielectric cap layer after the lithographic patterning constitute the first and second fin caps 18A, 18B. Another anisotropic etch is then performed to remove the exposed portions of the top semiconductor layer utilizing the first and second fin caps 18A, 18B as an etch mask. Remaining portions of the top semiconductor layer after the lithographic patterning constitute the semiconductor fins 16A, 16B. After transferring the pattern in the photoresist layer into the dielectric cap layer and the top semiconductor layer, the patterned photoresist layer can be removed utilizing a conventional resist stripping process such as, for example, ashing. Other methods known in the art, such as sidewall image transfer (SIT) or directional self-assembly (DSA), can also be used to pattern the dielectric cap layer and the top semiconductor layer.

Figure 2:
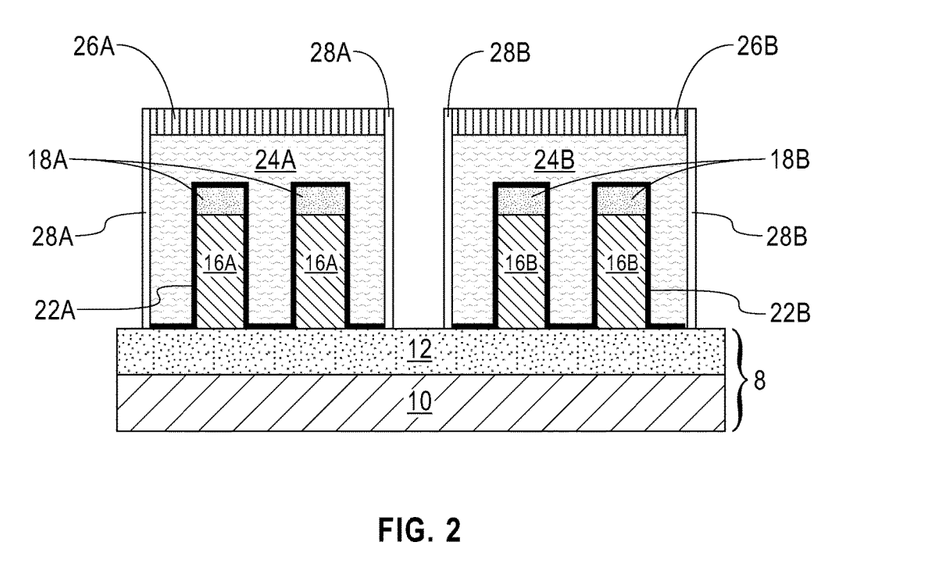
FIG. 2 is a cross-sectional view of the exemplary semiconductor structure of FIG. 1 after forming a first sacrificial gate structure straddling each first fin stack and a second sacrificial gate structure straddling each second fin stack.

Referring to FIG. 2, a first sacrificial gate structure is formed straddling each first fin stack (16A, 18A) and a second sacrificial gate structure is formed straddling each second fin stack (16B, 18B). The first sacrificial gate structure includes a first sacrificial gate stack of, from bottom to top, a first sacrificial gate dielectric 22A, a first sacrificial gate conductor 24A and a first sacrificial gate cap 26A. A first gate spacer 28A can be present on sidewalls of the first sacrificial gate stack (22A, 24A, 26A). The second sacrificial gate structure includes a second sacrificial gate stack of, from bottom to top, a second sacrificial gate dielectric 22B, a second sacrificial gate conductor 24B and a second sacrificial gate cap 26B. A second gate spacer 28B can be present on sidewalls of the second sacrificial gate stack (22B, 24B, 26B). In some embodiments of the present application, the first and the second sacrificial gate dielectrics 22A, 22B and/or the first and the second sacrificial gate caps 26A, 26B can be omitted.

The first sacrificial gate stack (22A, 24A, 26A) and the second sacrificial gate stack (22B, 24B, 26B) can be formed by first providing a material stack (not shown) that includes, from bottom to top, a sacrificial gate dielectric layer, a sacrificial gate conductor layer and a sacrificial gate cap layer over the first fin stacks (16A, 18A), the second fin stacks (16B, 18B) and the buried insulator layer 12. In some embodiments of the present application and as mentioned above, the sacrificial gate dielectric layer can be omitted. When present, the sacrificial gate dielectric layer includes a dielectric material such as an oxide or a nitride. In one embodiment, the sacrificial gate dielectric layer is composed of silicon dioxide, silicon nitride or silicon oxynitride. The sacrificial gate dielectric layer can be formed by a conventional deposition process, including but not limited to, CVD or PVD. The sacrificial gate dielectric layer can also be formed by conversion of a surface portion of the first and second semiconductor fins 16A, 16B. The sacrificial gate dielectric layer that is formed may have a thickness from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The sacrificial gate conductor layer can be formed using CVD or PECVD. The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

Subsequently, the material stack can be patterned by lithography and etching to form the first sacrificial gate stack (22A, 24A, 26A) and the second sacrificial gate stack (22B, 24B, 26B). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE to provide the first sacrificial gate stack (22A, 24A, 26A) and the second sacrificial gate stack (22B, 24B, 26B). The first sacrificial gate stack (22A, 24A, 26A) includes a first portion of the sacrificial gate dielectric layer (herein referred to as the first sacrificial gate dielectric 22A), a first portion of the sacrificial gate conductor layer (herein referred to as the first sacrificial gate conductor 24A) and a first portion of the sacrificial gate cap layer (herein referred to as the first sacrificial gate cap 26A) located in the first region of the substrate 8. The second sacrificial gate stack (22B, 24B, 26B) includes a second portion of the sacrificial gate dielectric layer (herein referred to as the second sacrificial gate dielectric 22B), a second portion of the sacrificial gate conductor layer (herein referred to as the second sacrificial gate conductor 24B) and a second portion of the sacrificial gate cap layer (herein referred to as the second sacrificial gate cap 26B) located in the second region of the substrate 8. The remaining portion of the photoresist layer may be subsequently removed by, for example, ashing.

The gate spacers 28A, 28B may include a dielectric material such as, for example, an oxide, a nitride, an oxynitride, or any combination thereof. In one embodiment, each of the first and the second gate spacers 28A, 28B is composed of silicon nitride. The gate spacers 28A, 28B can be formed by first conformally depositing a gate spacer material layer (not shown) on exposed surfaces of the sacrificial gate stacks (22A, 24A, 24A, 22B, 24B, 26B), the fin stacks (16A, 16A, 16B, 18B) and the buried insulator layer 12 utilizing any conventional deposition process including, for example, CVD or ALD. Subsequently, horizontal portions of the conformal gate spacer material layer are removed by an anisotropic etch, such as, for example, RIE. The RIE process is continued so that vertical portions of the conformal gate spacer material layer present on the sidewalls of the first semiconductor fins 16A and the second semiconductor fins 16B are also removed. Remaining vertical portions of the conformal gate spacer material layer present on sidewalls of the first sacrificial gate stack (22A, 24A, 26A) constitute the first gate spacer 28A. Remaining vertical portions of the conformal gate spacer material layer present on sidewalls of the second sacrificial gate stack (22B, 24B, 26B) constitute the second gate spacer 28B. The gate spacers 28A, 28B can have a width, as measured at the base, from 2 nm to 100 nm, with a width from 6 nm to 10 nm being more typical.

Figure 3:
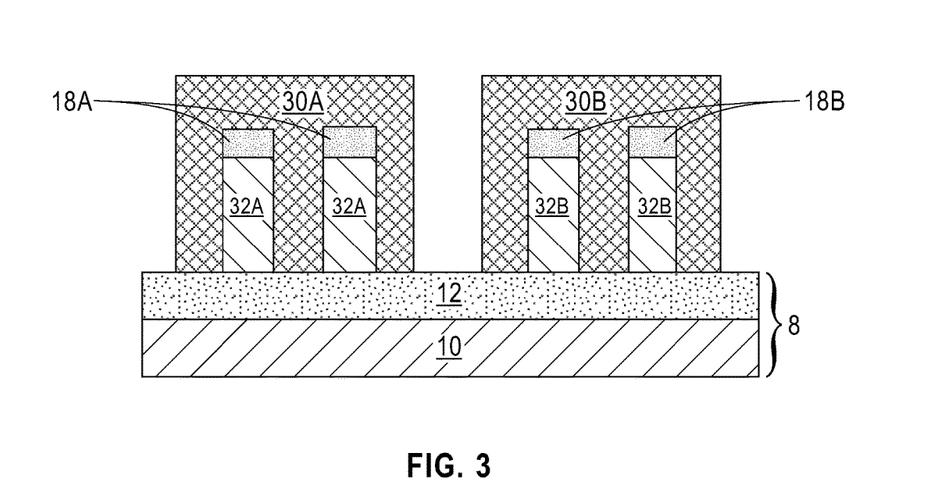
FIG. 3 is a cross-sectional view of the exemplary semiconductor structure of FIG. 2 after forming first fin and epitaxial source/drain regions on opposite sides of the first sacrificial gate structure and second fin and epitaxial source/drain regions on opposite sides of the second sacrificial gate structure.

Referring to FIG. 3, a first epitaxial source region and a first epitaxial drain region (collectively referred to as first epitaxial source/drain regions 30A) are formed on opposite sides of the first sacrificial gate structure (22A, 24A, 26A, 28B) in the first region of the substrate 8, while a second epitaxial source region and a second epitaxial drain region (collectively referred to as second epitaxial source/drain regions 30B) are formed on opposite sides of the second gate structure (22B, 24B, 26B, 28B) in the second region of the substrate.

The first and second epitaxial source/drain regions 30A, 30B can be formed by epitaxially depositing a semiconductor material over exposed semiconductor surfaces, i.e., sidewall surfaces of the first and second semiconductor fins 16A, 16B, but not on dielectric surfaces such as the surfaces of the first and second fin caps 18A, 18B, the first and second gate spacers 28A, 28B and the buried insulator layer 12. The semiconductor material can comprise Si, Ge, SiGe or SiC. In one embodiment and as shown in FIG. 3, the selective epitaxy growth process can proceed until the first epitaxial source/drain regions 30A merge the first semiconductor fins 16A and the second epitaxial source/drain regions 30B merge the second semiconductor fins 16B.

In one embodiment, the first and second epitaxial source/drain regions 30A, 30B can be formed with in-situ doping during the selective epitaxy process. Thus the first and second epitaxial source/drain regions 30A, 30B can be formed as doped semiconductor material portions. Alternatively, the first and second epitaxial source/drain regions 30A, 30B can be formed by ex-situ doping. In this case, the first and second epitaxial source/drain regions 30A, 30B can be formed as intrinsic semiconductor portions and dopants of a first conductivity type (which is p-type or n-type) can be subsequently introduced into the first and second epitaxial source/drain regions 30A, 30B to convert the intrinsic semiconductor material portions into doped semiconductor material portions. Exemplary n-type dopants include, but are not limited to, phosphorous, arsenic and antimony. Exemplary p-type dopants include, but are not limited to, aluminum, boron, gallium and indium. In one embodiment, each of the first and second epitaxial source/drain regions 30A, 30B includes phosphorus-doped SiC.

If ex-situ doping is employed, ion implantation or gas phase doping also introduce dopants into portions of the first semiconductor fins 16A that do not underlie the first sacrificial gate stack (22A, 24A, 26A) and portions of the second semiconductor fins 16B that do not underlie the second sacrificial gate stack (22B, 24B, 26B). The resulting doped portions within each first semiconductor fin 16A are herein referred to first fin source/drain regions 32A. The resulting doped portions within each second semiconductor fin 16A are herein referred to second fin source/drain regions 32B.

If in-situ doping is employed, an anneal process can be performed to outdiffuse the dopants from the first and second epitaxial source/drain regions 30A, 30B into underlying portions of the first and second semiconductor fins 16A, 16B to form the first fin source/drain regions 32A and the second fin source/drain regions 32B, respectively.

Figure 4:
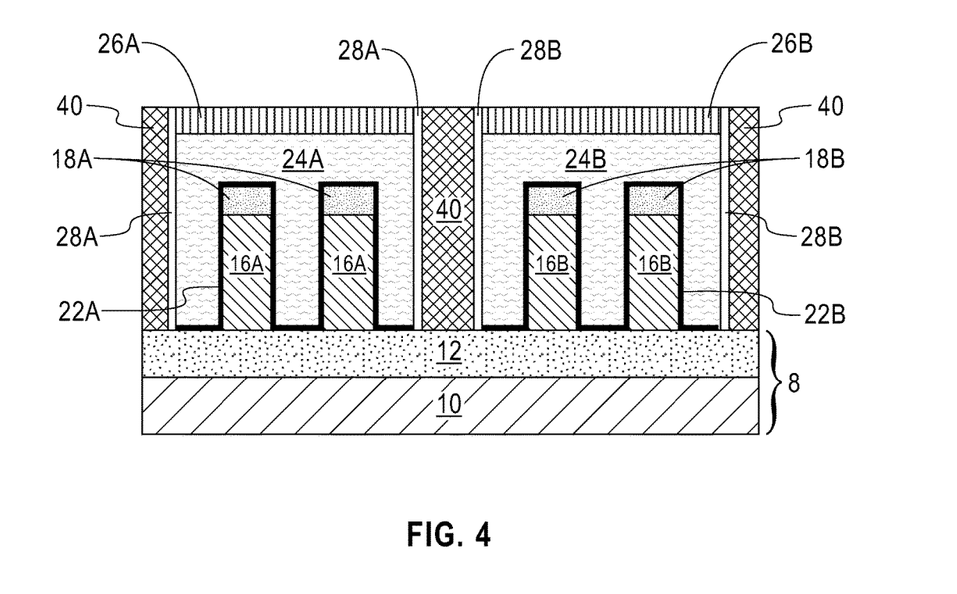
FIG. 4 is a cross-sectional view of the exemplary semiconductor structure of FIG. 3 after forming an interlevel dielectric (ILD) layer over the first and second epitaxial source/drain regions and the substrate to laterally surround the first sacrificial gate structure and the second sacrificial gate structure.

Referring to FIG. 4, an interlevel dielectric (ILD) layer 40 is formed over the first and second epitaxial source/drain regions 30A, 30B and the buried insulator layer 12 to laterally surround the first sacrificial gate structure (22A, 24A, 26A, 28A) and the second sacrificial gate structure (22B, 24B, 26B, 28B). In some embodiments of the present application, the ILD layer 40 is composed of a dielectric material that can be easily planarized. For example, the ILD layer 40 can include silicon dioxide, silicon nitride, silicon oxynitride or organo silicate glass (OSG). The ILD layer 40 can be formed by CVD, ALD, PVD or spin coating. The thickness of the ILD layer 40 can be selected so that an entirety of the top surface of the ILD layer 40 is formed above the top surfaces of the first and second sacrificial gate caps 26A, 26B. The ILD layer 40 can be subsequently planarized, for example, by chemical mechanical planarization (CMP) and/or by utilizing a recess etch employing the first and second sacrificial gate caps 26A, 26B as an etch stop. After the planarization, the ILD layer 40 has a top surface coplanar with the top surfaces of the first and second sacrificial gate caps 26A, 26B.

Figure 5:
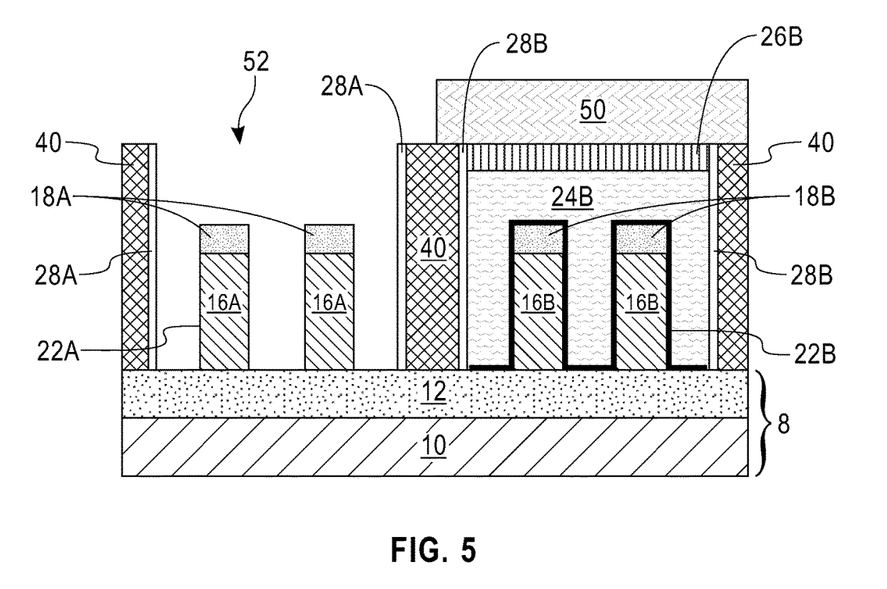
FIG. 5 is a cross-sectional view of the exemplary semiconductor structure of FIG. 4 after removing the first sacrificial gate stack to provide a first gate cavity.

Referring to FIG. 5, the first sacrificial gate stack (22A, 24A, 26A) is removed to provide a first gate cavity 52. A first mask layer (not shown) is applied over the first sacrificial gate structure (22A, 24A, 26A, 28A), the second sacrificial gate structure (22B, 24B, 26B, 28B) and the ILD layer 40 and then lithographically patterned so that a patterned first mask layer 50 covers the second sacrificial gate structure (22B, 24B, 26B, 28B) in the second region of the substrate 8, while exposing the first sacrificial gate structure (22A, 24A, 26A, 28A) in the first region of the substrate 8. Various components of the first sacrificial gate stack (22A, 24A, 26A) are subsequently removed selective to the buried insulator layer 12, the first fin stacks (16A, 18A) and the first gate spacer 28A utilizing at least one etch. The at least one etch can be a wet etch such as an ammonia etch or a dry etch such as RIE. The first gate cavity 52 thus formed occupies a volume from which the first sacrificial gate stack (22A, 24A, 26A) is removed and is laterally confined by the inner sidewalls of the first gate spacer 28A. The first gate cavity 52 exposes a portion of each first fin stack (16A, 16B) that is originally covered by the first sacrificial gate stack (22A, 24A, 26A).

Figure 6:
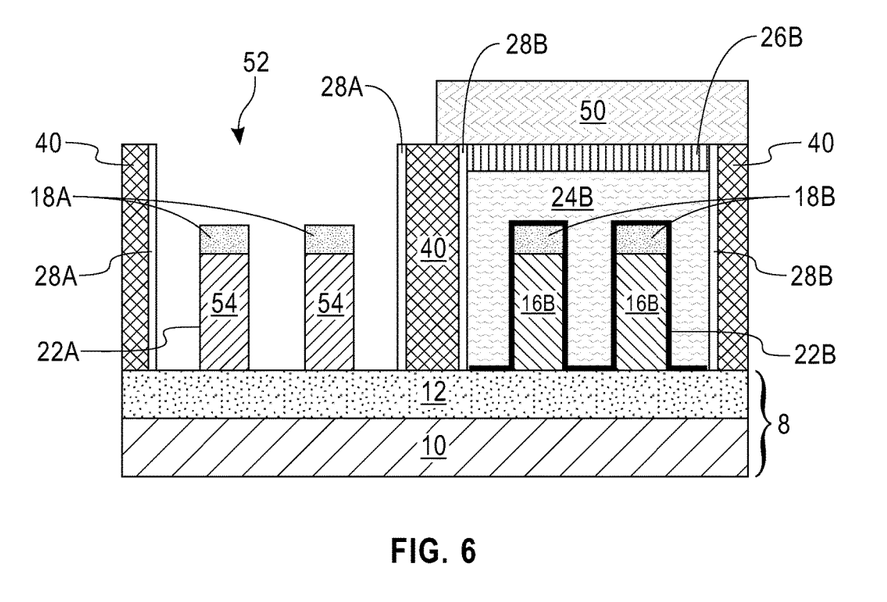
FIG. 6 is a cross-sectional view of the exemplary semiconductor structure of FIG. 5 after forming a first channel region by introducing dopants into a portion of a first semiconductor fin in each first fin stack that is exposed by the first gate cavity.

Referring to FIG. 6, a first channel region 54 is formed by introducing dopants into an exposed portion of each first semiconductor fin 16A utilizing ion implantation. The first channel region 54 is a doped semiconductor material portion. In one embodiment, the first channel region 54 contains dopants having a conductivity type that is the same as the dopants in the first fin source/drain regions 32A (i.e., the first conductivity type). For example, if the first fin source/drain regions 32A contain n-type dopants, the first channel region 54 also includes n-type dopants. In one embodiment, the first channel region 54 is composed of phosphorus-doped Si. The dopant concentration in the first channel region 54 can be from $1.0 \times 10^{17}$ atoms/cm$^3$ to $3.0 \times 10^{19}$ atoms/cm$^3$, although lesser and greater dopant concentrations can also be employed.

After formation of the first channel region 54 within each first semiconductor fin 16A, the patterned first mask layer 50 can be removed, for example, by oxygen-based plasma etching.

Figure 7:
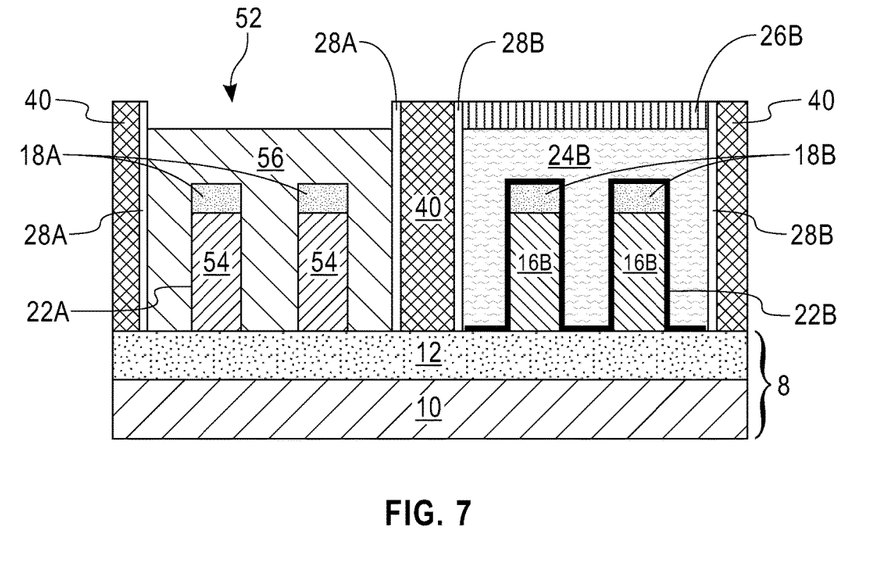
FIG. 7 is a cross-sectional view of the exemplary semiconductor structure of FIG. 6 after forming a semiconductor gate electrode overlying the first channel region.

Referring to FIG. 7, a semiconductor gate electrode 56 is formed in the first gate cavity 52 by a selective epitaxial growth process. During the selective epitaxial growth process, the semiconductor material providing the semiconductor gate electrode 56 grows only from the exposed semiconductor surfaces, i.e., sidewall surfaces of the first channel regions 54, but not on dielectric surfaces such as surfaces of the buried insulator layer 12, the first fin cap 18A, the second sacrificial gate cap 28B, and the first and second gate spacers 28A, 28B. The semiconductor gate electrode 56 may include a doped semiconductor material with dopants of a second conductivity type, which is opposite to the first conductivity type of dopants in the first channel region 54. For example, if the first conductivity type is n-type, the second conductivity type is p-type, and vice versa. A vertical p-n junction is thus formed at the interface between each first channel region 54 and the semiconductor gate electrode 56. The semiconductor materials providing the semiconductor gate electrode 56 can be selected from, but are not limited to, Si, Ge, SiGe and SiC, and can be the same as, or different from the semiconductor material providing the first semiconductor fins 16A. In one embodiment, the semiconductor gate electrode 56 includes boron-doped SiGe.

The semiconductor gate electrode 56 can be formed, for example, by CVD. Dopants may be introduced into the semiconductor gate electrode 56 by in-situ doping during the epitaxial growth of the semiconductor material providing the semiconductor gate electrode 56. The in-situ doping can improve the quality of the junction formed between each first channel regions 54 and the semiconductor gate electrode 56. The semiconductor gate electrode 56 can be deposited initially to fill the first gate cavity 52 and subsequently recessed to provide a void (not shown) on top of the semiconductor gate electrode 56. The top surface of the semiconductor gate electrode 56 is thus located below the top surface of the ILD layer 40.

Figure 8:
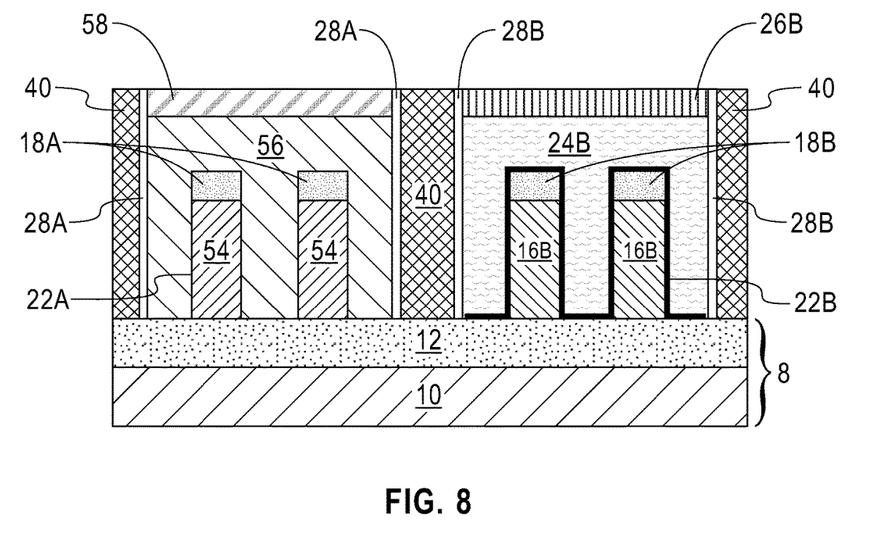
FIG. 8 is a cross-sectional view of the exemplary semiconductor structure of FIG. 7 after forming a first gate cap over the semiconductor gate electrode.

Referring to FIG. 8, a first gate cap 58 is formed over the semiconductor gate electrode 56 to completely fill the first gate cavity 52. The first gate cap 58 may be formed by depositing a dielectric material in the first gate cavity 52 and subsequently removing the deposited dielectric layer from the top surface of the ILD layer 40. The first gate cap 58 thus formed can have a top surface coplanar with the top surface of the ILD layer 40. Exemplary dielectric materials that can be employed in the first gate cap 58 include, but are not limited to, silicon nitride, silicon carbide nitride, and silicon boron carbonitride. The semiconductor gate electrode 56 and the first gate cap 58 together define a semiconductor gate stack for JFETs.

JFETs are thus formed in the first region of the substrate 8. Each JFET includes a first channel region 54 laterally surrounded by first fin source/drain regions 32A, first epitaxial source/drain regions 30A overlying the first fin source/drain regions 32A, and a semiconductor gate stack (56, 58) straddling the first channel region 54. In the present application and since the first fin cap 18A remains atop the first channel region 54, the semiconductor gate stack (56, 58) only contacts sidewalls of each first channel portion 54, resulting in formation of double-gated JFETs. The double-gated JFETs can have lower switching voltage and less noise compared to conventional single-gated JFETs.

Figure 9:
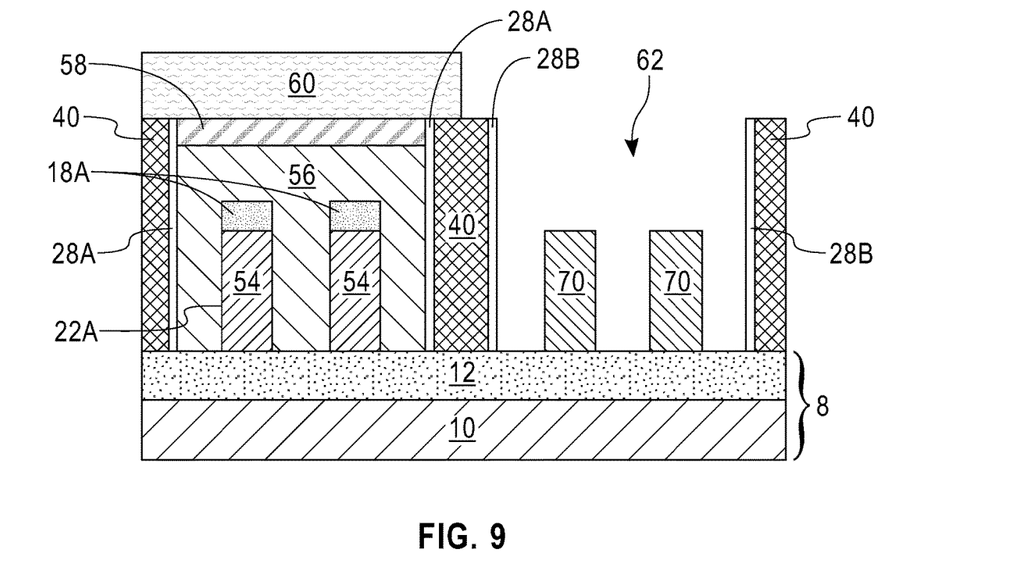
FIG. 9 is a cross-sectional view of the exemplary semiconductor structure of FIG. 8 after removing the second sacrificial gate stack to provide a second gate cavity and removing a second fin cap from top of a second semiconductor fin in each second fin stack.

Referring to FIG. 9, the second sacrificial gate stack (22B, 24B, 26B) is removed to provide a second gate cavity 62. The second sacrificial gate stack (22B, 24B, 26B) can be removed by at least one etch described above for removal of the first sacrificial gate stack (22A, 24A, 26A) while covering the first region of the substrate 8 with a patterned second mask layer 60. The second gate cavity 62 is formed in a space from which the second sacrificial gate stack (22B, 24B, 26B) is removed. The second gate cavity 62 exposes a portion of each second fin cap 18B and a portion of each second semiconductor fin 18B. The exposed portion of each second semiconductor fin 18B is herein referred to as a second channel region 70. In one embodiment, each second channel region 70 can be an intrinsic (i.e., non-doped) semiconductor material portion.

Subsequently, the exposed portion of each second fin cap 18B is removed from the top of the second channel region 70, for example, by an etch process that removes the dielectric material of the second fin cap 18B selective to the dielectric materials of the second gate spacer 28B, the ILD layer 40 and the buried insulator layer 12 as well as the semiconductor material of the second semiconductor fins 16B. The etch process can be a dry etch such as, for example, RIE or a wet etch. Alternatively, the removal of the exposed portion of each second fin cap 18B can be achieved by performing a planarization process such as CMP. The top surface and sidewall surfaces of each second channel portion 70 are thus exposed by the second gate cavity 62.

Following the removal of the exposed portion of each second fin cap 18B, the patterned second mask layer 60 can be removed, for example, by oxygen-based plasma etching.

Figure 10:
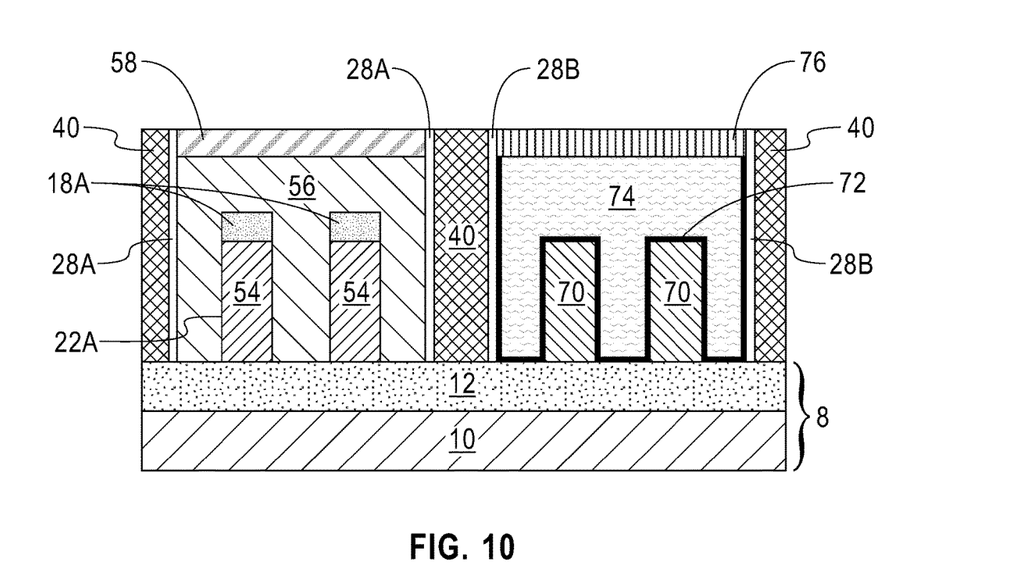
FIG. 10 is a cross-sectional view of the exemplary semiconductor structure of FIG. 9 after forming a metal gate stack within the second gate cavity straddling a second channel region of each second semiconductor fin that is exposed by the second gate cavity.

Referring to FIG. 10, a metal gate stack is formed within the second gate cavity 62 straddling the second channel region 70 of each second semiconductor fin 16B. The metal gate stack includes, from bottom to top, a gate dielectric 72, a metal gate electrode 74 and a second gate cap 76.

The metal gate stack (72, 74, 76) can be formed by first depositing a conformal gate dielectric layer (not shown) on exposed surfaces (i.e., sidewalls and a top surface) of each second channel portion 70 and within the second gate cavity 62. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$ and $Y_2O_3$. In one embodiment, the gate dielectric layer includes $HfO_2$. The gate dielectric layer can be formed by a conventional deposition process including, but not limited to, CVD, PVD, atomic layer deposition (ALD), molecular beam epitaxy (MBE), ion beam deposition, electron beam deposition, and laser assisted deposition. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

The remaining volume of the second gate cavity 62 is then filled with a metal gate electrode layer (not shown). Exemplary metals that can be employed in the metal gate electrode layer include, but are not limited to, tungsten, titanium, tantalum, aluminum, nickel, ruthenium, palladium and platinum. In one embodiment, the metal gate electrode layer is comprised of tungsten. The metal gate electrode layer can be formed utilizing a conventional deposition process including, for example, CVD, PECVD, PVD, sputtering, chemical solution deposition and ALD.

In some embodiment of the present application, and prior to the formation of the metal gate electrode layer, a work function metal layer (not shown) may be conformally deposited over the gate dielectric layer employing CVD, sputtering or plating. The work function metal layer includes a metal having a work function suitable to tune the work function of MOSFETs subsequently formed. The thickness of the work function metal layer can be from 3 nm to 15 nm, although lesser and greater thicknesses can also be employed.

The portion of the metal gate electrode layer formed above the top surfaces of the first gate cap 58, the gate spacers 28A, 28B and the ILD layer 40 can be removed, for example, by CMP. The portion of the gate dielectric layer that is formed above the top surfaces of the first gate cap 58, the gate spacers 28A, 28B and the ILD layer 40 may also be subsequently removed. In some embodiments and as illustrated, the remaining portions of the metal layer and the remaining portions of the gate dielectric layer may be recessed utilizing a dry etch or a wet etch to provide a void (not shown) in the second gate cavity 62. The remaining portion of the metal gate layer constitutes the metal gate electrode 74, and the remaining portion of the gate dielectric layer constitutes the gate dielectric 72.

A dielectric material is then deposited over the gate dielectric 72 and the metal gate electrode 74 in the second gate cavity 62 to completely fill the void. The deposited dielectric material is then planarized, for example, by CMP using the top surface of the ILD layer 40 as an etch stop to form the second gate cap 76. The second gate cap 76 may include a dielectric material that is the same as, or different from, the first gate cap 58. In one embodiment, each of the second gate cap 76 and the first gate cap 58 includes silicon nitride. The top surface of the second gate cap 76 is coplanar with the top surface of the ILD layer 40.

MOSFETs are thus formed in the second region of the substrate 8. Each MOSFET includes a second channel region 70 laterally surrounded by second fin source/drain regions 32B, second epitaxial source/drain region 30B overlying the second fin source/drain regions 32B, and a metal gate stack (72, 74, 76) straddling the second channel region 70. The metal gate stack (72, 74, 76) includes a vertical stack of a gate dielectric 72, a metal gate electrode 74 and a second gate cap 76. In the present application and since the second fin cap 18B is removed from the top of the second channel region 70, the metal gate stack (72, 74, 76) contacts a top surface and opposite sidewalls of each second channel portion 70, resulting in formation of tri-gated MOSFETs.

Figure 11:
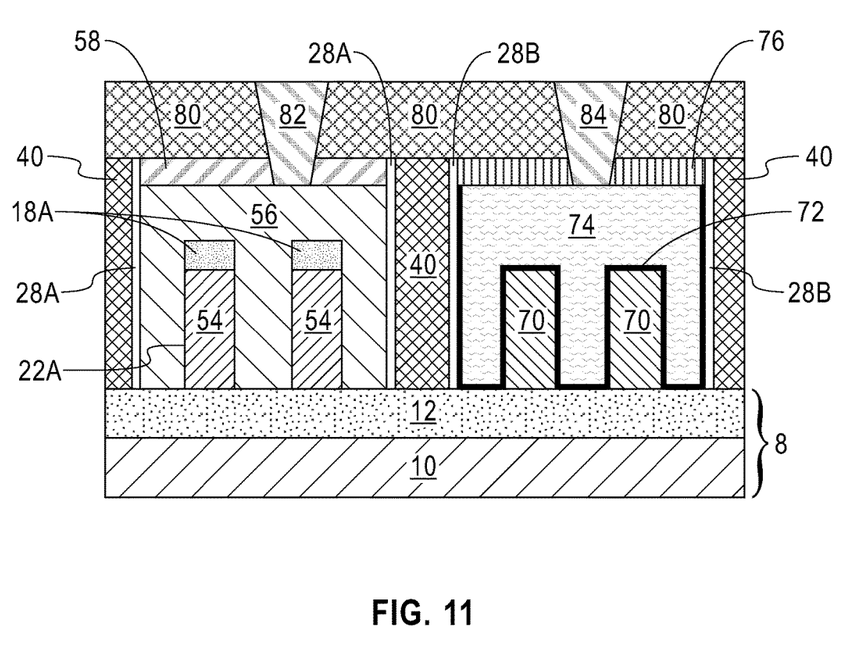
FIG. 11 is a cross-sectional view of the exemplary semiconductor structure of FIG. 10 after forming gate contact structures.

Referring to FIG. 11, a contact level dielectric layer 80 is formed over the ILD layer 40, the first gate cap 58, the second gate cap 76 and the gate spacers 28A, 28B. The contact level dielectric layer 80 may include a dielectric material such as, for example, oxides, nitrides or oxynitrides. In one embodiment, the contact level dielectric layer 80 includes silicon dioxide. The contact level dielectric layer 80 may be formed, for example, by CVD or spin-coating. The contact level dielectric layer 80 may be self-planarizing, or the top surface of the contact level dielectric layer 80 can be planarized, for example, by CMP. In one embodiment, the planarized top surface of the contact level dielectric layer 80 is located above the top surface of the ILD layer 40.

A first gate contact structure 82 is formed to provide an electrical contact to the semiconductor gate electrode 56 of the JFETs, and a second gate contact structure 84 is formed to provide an electrical contact to the metal gate electrode 74 of the MOSFETs. The first gate contact structure 82 extends through the contact level dielectric layer 80 and the first gate cap 58 to form contact with the semiconductor gate electrode 56. The second gate contact structure 84 extends through the contact level dielectric layer 80 and the second gate cap 76 to form contact with the metal gate electrode 74. The first and the second gate contact structures 82, 84 can be formed by formation of contact openings (not shown) in the contact level dielectric layer 80 utilizing a combination of lithographic patterning and anisotropic etch followed by deposition of a conductive material (e.g., copper) and planarization that removes an excess portions of the conductive material from above the top surface of the contact level dielectric layer 80. Optionally, contact liners (not shown) may be formed on the sidewalls and bottoms surfaces of the contact openings before filling the contact openings with the conductive material. The contact liners may include TiN.

It should be noted that although in the illustrated embodiment JEFTs are formed before the formation of MFETs, the order of forming MOSFETs and JEFTs can be reversed, i.e., MOSFETs can be formed before the formation of JFETs.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a junction field effect transistor (JFET) located in a first region of a substrate, the JFET comprising:
      a fin stack of a first semiconductor fin and a first fin cap atop the first semiconductor fin, the first semiconductor fin comprising a first channel region and first fin source/drain regions laterally surrounding the first channel region, wherein the first channel region and the first fin source/drain regions comprise a first semiconductor material and dopants of a first conductivity type, and
      a semiconductor gate stack straddling the fin stack to form contact with a top surface of the first fin cap and sidewall surfaces of the first channel region, wherein the semiconductor gate stack comprises a semiconductor gate electrode comprising a second semiconductor material and dopants of a second conductivity type that is opposite to the first conductivity type; and
   a metal-oxide-semiconductor field effect transistor (MOSFET) located in a second region of the substrate, the MOSFET comprising:
      a second semiconductor fin comprising a second channel region and second fin source/drain regions laterally surrounding the second channel region, wherein the second fin source/drain regions comprise the first semiconductor material and dopants of the first conductivity type, and
      a metal gate stack straddling the second semiconductor fin to form contact with a top surface and sidewall surfaces of the second channel region, wherein the metal gate stack comprises a gate dielectric and a metal gate electrode surrounded by the gate dielectric.

2. The semiconductor structure of claim 1, wherein the first semiconductor material is different from the second semiconductor material.

3. The semiconductor structure of claim 2, wherein the semiconductor gate electrode comprises boron-doped SiGe, and the first channel region comprises phosphorus-doped Si.

4. The semiconductor structure of claim 1, wherein the metal gate electrode comprises tungsten, titanium, tantalum, aluminum, nickel, ruthenium, palladium or platinum.

5. The semiconductor structure of claim 1, wherein the gate dielectric comprises $HfO_2$, $ZrO_2$, $La_2O_3$, $Al_2O_3$, $TiO_2$, $SrTiO_3$, $LaAlO_3$ or $Y_2O_3$.

6. The semiconductor structure of claim 1, wherein the JFET further comprises first epitaxial source/drain regions located over the first fin source/drain regions, and the MOSFET further comprises second epitaxial source/drain regions located over the first fin source/drain regions, wherein each of the first epitaxial source/drain regions and second epitaxial source/drain regions comprises a third semiconductor material and dopants of the first conductivity type.

7. The semiconductor structure of claim 6, wherein the third semiconductor material is different from the first semiconductor material.

8. The semiconductor structure of claim 7, wherein the first semiconductor material is Si and the third semiconductor material is SiC.

9. The semiconductor structure of claim 6, wherein each of the first epitaxial source/drain regions and second epitaxial source/drain regions comprises phosphorus-doped SiC.

10. The semiconductor structure of claim 1, wherein the semiconductor gate stack further comprises a first gate cap located over the semiconductor gate electrode, and the metal gate stack further comprises a second gate cap located over the gate dielectric and the metal gate electrode.

11. The semiconductor structure of claim 1, wherein the second channel region is an intrinsic semiconductor material portion.

12. The semiconductor structure of claim 1, wherein the first conductivity type is n-type, and the second conductivity type is p-type.

13. The semiconductor structure of claim 1, wherein the first fin cap comprises silicon dioxide, silicon nitride, silicon oxynitride, a dielectric metal oxide or a combination thereof.

14. The semiconductor structure of claim 1, wherein the JFET further comprises a first gate spacer present on sidewalls of the semiconductor gate stack, and the MOSFET further comprises a second gate spacer present on sidewalls of the metal gate stack.

15. The semiconductor structure of claim 1, further comprising an interlevel dielectric (ILD) layer located over the substrate and laterally surrounding the semiconductor gate stack and the metal gate stack.

16. The semiconductor structure of claim 15, wherein the ILD layer has a top surface coplanar with a topmost surface of each of the semiconductor gate stack and the metal gate stack.

17. The semiconductor structure of claim 15, further comprising a first gate contact structure overlying a top surface of the semiconductor gate electrode of the semiconductor gate stack, and a second gate contact structure overlying a top surface of the metal gate electrode of the metal gate stack.

18. The semiconductor structure of claim 17, each of the first gate contact structure and the second gate contact structure comprises a conductive material.

19. The semiconductor structure of claim 17, further comprising a contact level dielectric layer overlying the ILD layer, wherein the contact level dielectric layer laterally surrounds the first gate contact structure and second gate contact structure.

20. The semiconductor structure of claim 1, wherein the substrate comprises a buried insulator layer and a handle layer underlying the buried insulator layer, wherein the first semiconductor fin and the second semiconductor fin are in contact with the buried insulator layer.

* * * * *